United States Patent
Ma et al.

(10) Patent No.: US 7,142,940 B2
(45) Date of Patent: Nov. 28, 2006

(54) METHOD OF PROCESSING SEMICONDUCTOR WAFER

(75) Inventors: Hong Ma, Singapore (SG); Meisheng Zhou, Singapore (SG)

(73) Assignee: UMCI Ltd., Singapore (SG)

( * ) Notice: Subject to any disclaimer, the term of this patent is extended or adjusted under 35 U.S.C. 154(b) by 0 days.

(21) Appl. No.: 11/079,995

(22) Filed: Mar. 14, 2005

(65) Prior Publication Data

US 2006/0206228 A1    Sep. 14, 2006

(51) Int. Cl.
*G06F 19/00* (2006.01)
(52) U.S. Cl. ..................... 700/121; 700/104
(58) Field of Classification Search ............ 700/28, 700/104, 108, 117, 121
See application file for complete search history.

(56) References Cited

U.S. PATENT DOCUMENTS

| | | | |
|---|---|---|---|
| 4,846,626 A * | 7/1989 | Engelbrecht | 414/754 |
| 6,486,492 B1 * | 11/2002 | Su | 257/48 |
| 6,496,749 B1 * | 12/2002 | Yamaguchi et al. | 700/121 |
| 6,640,151 B1 * | 10/2003 | Somekh et al. | 700/121 |
| 6,858,361 B1 * | 2/2005 | Mui et al. | 430/30 |
| 6,868,326 B1 * | 3/2005 | Yasui | 701/101 |
| 6,972,853 B1 * | 12/2005 | Stirton et al. | 356/630 |
| 6,985,215 B1 * | 1/2006 | Oh et al. | 356/72 |
| 2003/0165755 A1 * | 9/2003 | Mui et al. | 430/30 |
| 2005/0171626 A1 * | 8/2005 | Schwarm | 700/108 |
| 2006/0031788 A1 * | 2/2006 | Bauer | 716/1 |

* cited by examiner

Primary Examiner—Jayprakash N. Gandhi
(74) Attorney, Agent, or Firm—J.C. Patents

(57) ABSTRACT

A method of processing a semiconductor wafer is provided. The semiconductor wafer is processed with a first process. After collecting the measured data that reflects the deviation of each part within the semiconductor wafer, the semiconductor wafer is processed with a second process according to the measured data to compensate the deviation from the first process and to correct any deviation in the semiconductor wafer.

20 Claims, 3 Drawing Sheets

METHOD OF PROCESSING SEMICONDUCTOR WAFER

BACKGROUND OF THE INVENTION

1. Field of the Invention

The present invention relates to a semiconductor wafer treatment method. More particularly, the present invention relates to a treatment method for rectifying a deviation within a semiconductor wafer generated from a process.

2. Description of Related Art

With the current semiconductor manufacturing technology, multiple process steps are involved in the manufacturing of a semiconductor device, ranging from the manufacturing of semiconductor wafer materials to the packaging of the semiconductor device. Further, each process step affects profoundly the critical dimension and the specification of the semiconductor device. Therefore, the process parameters in each process step are carefully adjusted to effectively control the quality of the product.

Advanced process control (APC) is an essential methodology used in maintaining and controlling critical processes during the fabrication of integrated circuits. In a semiconductor process, an individual or an integrated calculating tool is applied to achieve the wafer-to-wafer or run-to-run advanced process control. A wafer-to-wafer advanced process control basically includes performing a calculation according to the information obtained from a wafer subsequent to a treatment, and feeding-back the calculated result to a process for a next wafer. The run-to-run process control, on the other hand, includes integrating information of the process equipment and of the manufacturing process and variables of the process status and of the wafer quality control, estimating through process modeling, and feeding-back on-line to adjust the process parameters.

Whether a wafer-to-wafer or a run-to-run advanced process control method is applied, a feed-back process is used to adjust a subsequent wafer process. However, the critical dimensions of different parts of a wafer vary after a process is performed on the wafer. For example, the critical dimension at the central region of the wafer deviates from the critical dimension at the peripheral of the wafer. When a subsequent process is performed on the wafer, the deviation between the central region and the peripheral region of the wafer becomes more prominent. As a result, the characteristic of the semiconductor wafer is inconsistent. Since the conventional advanced process control is only directed to wafer-to-wafer or run-to-run process control, a localized compensation within a wafer is not provided. Therefore, any the deviation in the critical dimensions or other critical control variables within a wafer can not be resolved.

SUMMARY OF THE INVENTION

According, at least one object of the present invention is to provide a semiconductor wafer treatment method to effectively rectify a deviation within a same semiconductor wafer.

The present invention provides a semiconductor wafer treatment method, wherein a first process is performed on the semiconductor wafer. A measured data is obtained from the first semiconductor wafer after the first process. The measured data reflects the deviation at different parts within a single wafer. Based on the measured data, a second process is performed on the same semiconductor wafer.

In accordance to one embodiment of the present invention, the above-mentioned semiconductor wafer treatment method further includes using an advanced process control device to perform a calculation on the measured data in order to obtain an operation parameter for the second process before proceeding to the second process. The operation parameter is fed forward to the second process.

According to one embodiment of the present invention, the first manufacturing process of the above-mentioned semiconductor wafer treatment method includes a deposition process, a photolithography process, an etching process or a planarization process.

According to one embodiment of the invention, the second manufacturing process of the above-mentioned semiconductor wafer treatment method includes a deposition process, a photolithography process, an etching process or a planarization process.

According to one embodiment of the invention, the above semiconductor treatment method includes the first manufacturing process being a deposition process, and the second manufacturing process being an etching process.

According to one embodiment of the invention, the above semiconductor treatment method includes the first manufacturing process being a deposition process, and the second manufacturing process being a chemical mechanical polishing process.

According to one embodiment of the invention, the above semiconductor treatment method includes the first manufacturing process being an etching process and the second manufacturing process being a deposition process.

According to one embodiment of the invention, the above semiconductor treatment method includes the first manufacturing process being a chemical mechanical polishing process and the second manufacturing process being a deposition process.

According to one embodiment of the invention, the above semiconductor treatment method includes the first manufacturing process being a photolithography process and the second manufacturing process being an etching process.

According to one embodiment of the invention, the above semiconductor treatment method includes the first manufacturing process being an etching process and the second manufacturing process being a chemical mechanical process.

According to one embodiment of the invention, the above semiconductor treatment method includes the first manufacturing process being an etching process and the second manufacturing process being an etching process.

According to one embodiment of the present invention, the measured data of the above-mentioned semiconductor wafer treatment method includes a thickness of a film, a depth of a trench or a line width.

The present invention further provides a semiconductor wafer treatment method, wherein a first process is performed on the semiconductor wafer. A first measured data is obtained after performing the first manufacturing process on the semiconductor wafer, wherein the first measured data reflects the deviation of different parts within a single wafer. Thereafter, a second manufacturing process is performed on the same semiconductor wafer according to the second measured data to compensate the deviation generated in the first manufacturing process. A second measured data is then obtained after the second manufacturing process is performed, wherein the second measured data reflects the deviation of different part within the same semiconductor wafer. Thereafter, a third manufacturing process is performed on the same semiconductor wafer based on the second measured data to compensate the deviation generated in the second manufacturing process.

According to another embodiment of the present invention, before performing the second manufacturing process, the semiconductor wafer treatment method further includes using an advanced process control device to conduct a calculation on the first measured data to obtain a first operation parameter for the second manufacturing process. Thereafter, the first operation parameter is fed forward to the second manufacturing process.

In accordance to another embodiment of the present invention, the above-mentioned semiconductor wafer treatment method further includes using an advanced process control device to perform a calculation based on the second measured data to obtain a second operation parameter. The second operation parameter is then fed forward to the third manufacturing process.

According to another embodiment of the present invention, the first manufacturing process of the semiconductor wafer treatment method includes a deposition process, a photolithography process, an etching process or a planarization process.

According to another embodiment of the present invention, the second manufacturing process of the semiconductor wafer treatment method includes a deposition process, a photolithography process, an etching process or a planarization process.

According to yet another embodiment of the present invention, the third manufacturing process of the semiconductor wafer treatment methorand a planarization process.

According to another embodiment of the present invention, the first measured data of the semiconductor wafer treatment method includes a film thickness, a depth of a trench or a line width.

According to another embodiment of the present invention, the second measured data of the semiconductor wafer treatment method includes a thickness of a film, a depth of a trench or a line width.

According to the semiconductor wafer treatment method of the present invention, performing a second manufacturing process subsequent to the first manufacturing process can compensate and remedy the deviation generated in the first manufacturing process.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
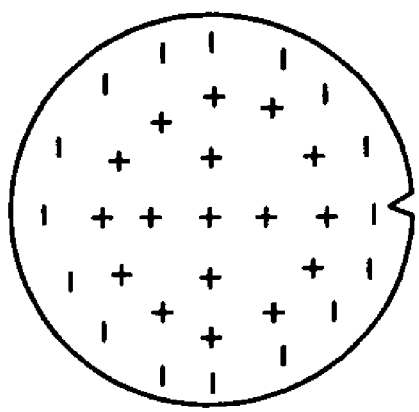
FIGS. 1A to 1C are schematic diagrams of a wafer illustrating the distributions of critical dimensions across the wafer after a sequence of processes to demonstrate the basic concept of the present invention.
Figure 1B:
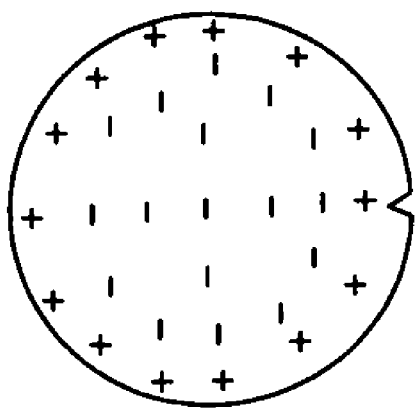
Figure 1C:
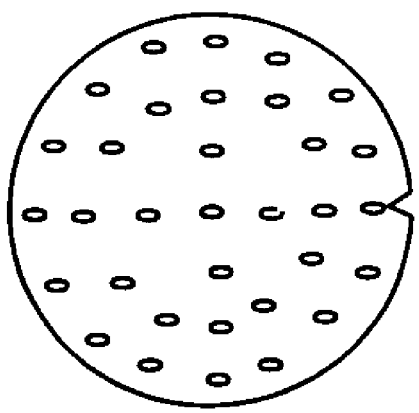

FIGS. 1A to 1C are are schematic diagrams of a wafer illustrating the distributions of critical dimensions across the wafer after a sequence of processes to demonstrate the basic concept of the present invention.

Referring to FIG. 1A, after a first manufacturing process is performed, the critical dimensions of the wafer are smaller than the average value at the peripheral region (as depicted by the symbol '−'), while the critical dimensions of wafer are greater than the average value at the center of the wafer (as depicted by the symbol '+'). After a first process deviation is determined, an adjustment is conducted in a second manufacturing process. As shown in FIG. 1B, the effect of the second manufacturing process on the same wafer includes providing the critical dimensions at the peripheral being greater than the average value (as depicted by the symbol '+') and the critical dimensions at the center being smaller than the average value (as depicted by the symbol '−'). As a result, the deviation generated in the first process is compensated and the critical dimensions at each part of the wafer are equal to the average value (as depicted by the symbol '0'). The most ideal critical dimension distribution is produced.

Figure 2:
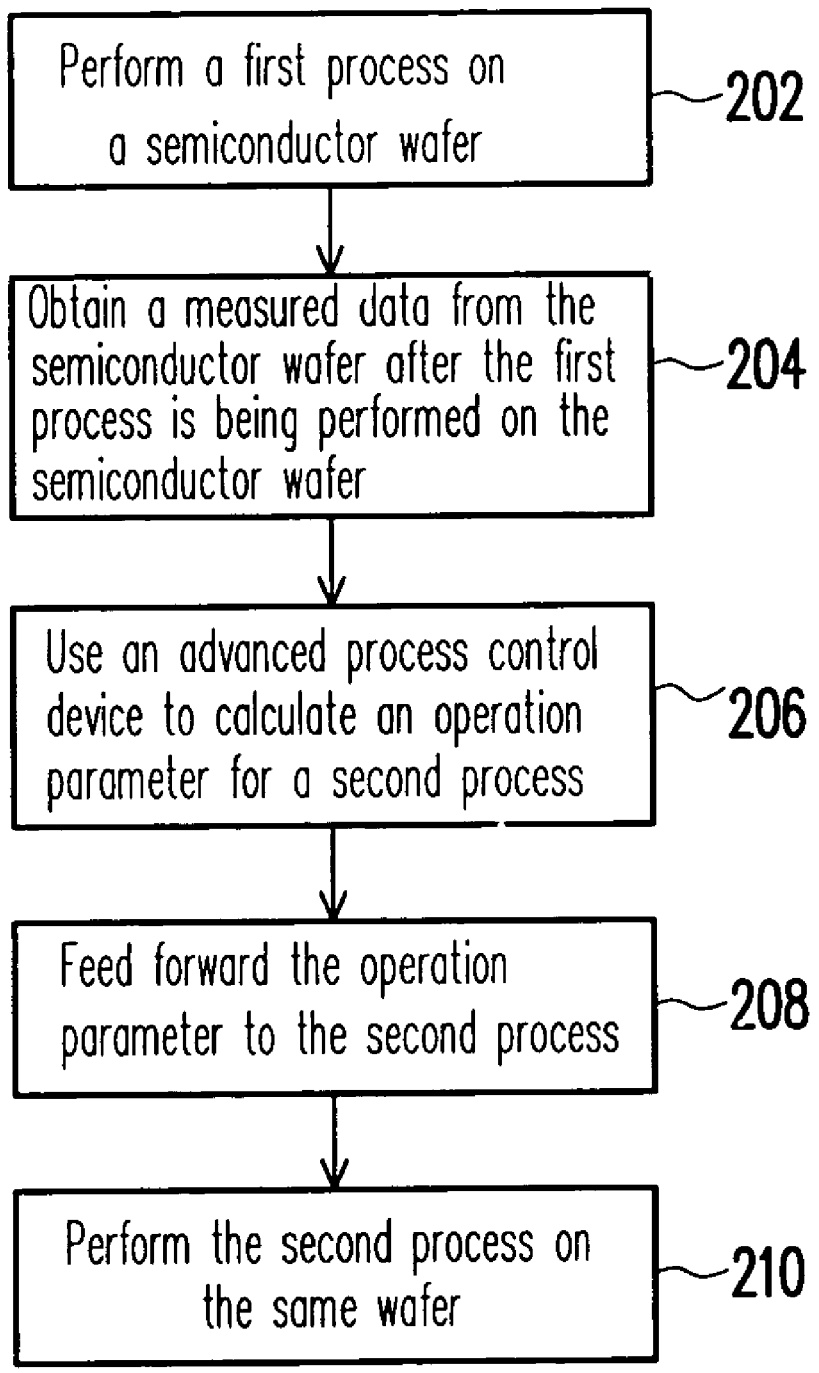
FIG. 2 is a flow diagram illustrating the process steps of the semiconductor wafer treatment method according to one embodiment of the present invention.

As embodied hereinafter is a semiconductor wafer treatment method of the present invention. As shown in FIG. 2, FIG. 2 is a flow diagram illustrating the process steps of the semiconductor wafer treatment method according to one embodiment of the present invention.

Referring to FIG. 2, in step 202, a first manufacturing process is performed on a semiconductor wafer, wherein the first manufacturing process includes a deposition process, a photolithography process, an etching process, a planarization process or other process.

Continuing to step 204, a measured data is obtained from the semiconductor wafer after the first manufacturing process is performed on the wafer. The measured data includes, for example, a thickness of film, a depth of a trench or a line width, etc. The measured data reflects the deviation of different parts within the semiconductor wafer. In other words, the measured date reflects whether the semiconductor wafer achieves the manufacturing target after the first manufacturing process.

In step 206, an advanced process control device is used to perform a calculation on the measured data to obtain an operation parameter for the second manufacturing process. In other words, based on the deviation generated in the first manufacturing process, the operation parameter required for the second manufacturing process is determined. For example, when the second process is an etching process or a planarization process, the operation parameter includes an etching rate or a polishing rate.

In step 208, the operation parameter is fed to the second process. In other words, the operation parameter serves as an input parameter of the second manufacturing process.

Referring to step 210, the second manufacturing process is performed on the same semiconductor wafer, wherein the deviation generated in the first manufacturing process are compensated so that the expected manufacturing target for the semiconductor wafer is achieved after the second manufacturing process.

In another embodiment of the present invention, if the process standard is not achieved after the second process, the deviation generated in the second process can be compensated by a third process subsequent to the second process.

For example, if the first manufacturing process is, for example a deposition process, and the deposited film is not uniform across the wafer, the non-uniformity can be compensated by a second manufacturing process. The second manufacturing process is, for example, an etching process or a chemical mechanical polishing process. The way to compensate the non-uniformity generated in the deposition process includes attenuating the etching rate or the polishing rate at the various parts of the wafer to rectify the deviation generated in the deposition process. Conversely, a thickness of a film generated from a deposition process can be adjusted to compensate the deviation in the thickness of a film after an etching process or a chemical mechanical polishing process.

In another example, when the first process is a photolithography process, and there is a deviation in the critical dimension of the photoresist, the deviation can be compensated in the second process. When the second process is an etching process, for example, the distribution of the etching rates across the wafer is adjusted to correct the deviation generated in the first process.

Further, when the first process is an etching process, any non-unformity in the film thickness after the etching process can be compensated in the second process. When the second manufacturing process is, for example, a chemical mechanical polishing process, the polishing rates at the various parts of the wafer in the chemical mechanical process can be adjusted to rectify the deviation generated in the first manufacturing process.

Moreover, when the first manufacturing process is an etching process, any non-uniformity in the film thickness after the etching process can be compensated in a second process. When the second manufacturing process is an etching process, the etching rates at the various parts of the wafer can be adjusted in the second etching process to rectify the deviation generated in the first manufacturing process.

Based on the foregoing description, the semiconductor wafer treatment method of the present invention includes after a manufacturing process is conducted on a wafer, performing a subsequent process on the same semiconductor wafer can compensate the deviation generated in the previous manufacturing process.

FIGS. 3A to 3D are schematic, cross-sectional view diagrams of a semiconductor wafer in selected process steps of the fabrication.

Figure 3A:
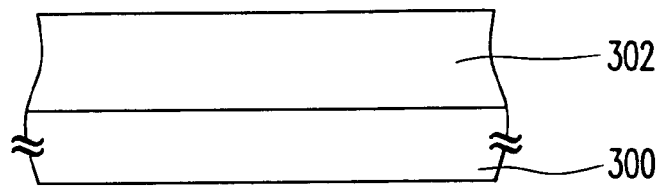
FIGS. 3A to 3D are schematic, cross-sectional view diagrams of a semiconductor wafer in selected process steps of the fabrication.

Referring to FIG. 3A, a dielectric layer 302 is formed on a semiconductor substrate 300. The dielectric layer 302 is formed with, for example, silicon oxide by a chemical vapor deposition method.

Figure 3B:
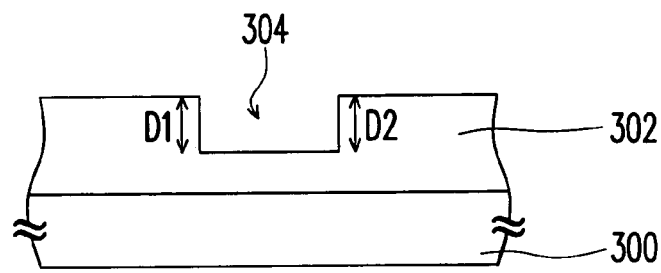

Continue to FIG. 3B, a trench 304 is formed in the dielectric layer 302. Based on the information on the depth of the trench, the depth of the trench 304 is showned to be not uniformed. The depth of the trench actually includes a first depth D1 and a second depth D2, wherein D2 is greater than D1. Forming the trench 302 includes forming a patterned photoresist layer on the dielectric layer 302, followed by conducting an etching process. The non-uniform depth of the trench is generated from the etching process.

Figure 3C:
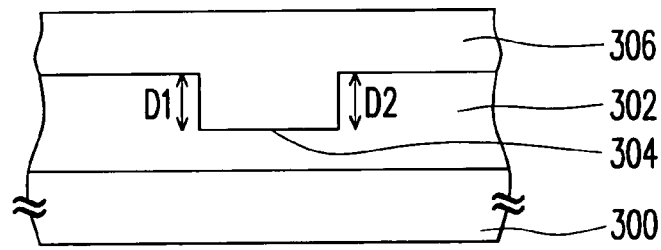

As shown in FIG. 3C, a conductive layer 304 is formed on the dielectric layer 302 filling the trench 304, wherein the conductive layer 304 includes a copper material and is formed by chemical vapor deposition, for example. In another embodiment, a barrier layer (not shown) is deposited on the dielectric layer 302 before the formation of the conductive layer 304.

Figure 3D:
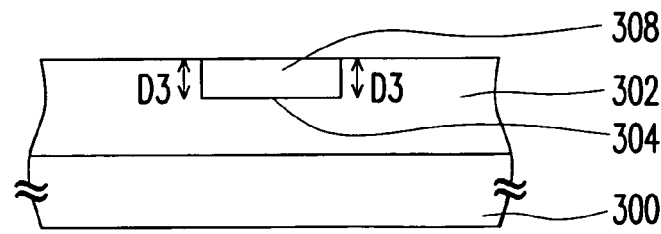

Referring to FIG. 3D, a planarization process is performed on the conductive layer 308 to form the conductive line 308 and normalize the depth of the trench to D3. The planarization process includes a chemical mechanical polishing process having a polishing rate R1 at the part of the trench with the depth D1, and the polishing rate R2 at the part of the trench with the depth D2, wherein R1 is greater than R2. The polishing rates R1 and R2 at the parts of the trench with the depths D1 and D2, respectively are obtained based on a calculation on the measured data (D1 and D2) using an advanced process control device.

According to the foregoing description, if the depth of a trench formed after an etching process is not uniform (depth D1 is greater than depth D2). Such a deviation can be compensated by adjusting the operation parameter of the planarization process to obtain a uniform depth for the trench.

The above illustrated embodiment discloses to two process steps. It is to be understood that, in other embodiments, a semiconductor process that includes multiple process steps can apply the principles provided by the present invention, in which a measured data is obtained from a single wafer after a first process step. Further using the measured data to modify and adjust the subsequent process to obtain a uniform critical dimension across the entire wafer.

Accordingly, the present invention provides a semiconductor wafer treatment method, wherein the deviation generated after a manufacturing process is performed on a semiconductor wafer can be compensated by performing a calculation on a measured data of the deviation to obtain an operation parameter for a subsequent process. Not only the deviation generated from a previous manufacturing process can be compensated, the reliability and the yield of the device can also be improved.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A semiconductor wafer treatment method comprising:
    performing a first process on a semiconductor wafer;
    obtaining a measured data from the semiconductor wafer after the first process is performed on the semiconductor wafer, wherein the measured data reflects a deviation of each part within the wafer; and
    performing a second process on the semiconductor wafer after the first process based on the measured data to compensate the deviation generated in the first process.

2. The method of claim 1, wherein before the step of performing the second process, the method further comprises:
    using an advanced process control device to perform a calculation on the measured data to obtain an operation parameter for the second process; and
    feeding forward the operation parameter to the second process.

3. The method of claim 1, wherein the first process comprises a process selected from the group consisting of a deposition process, a photolithography process, an etching process and a planarization process.

4. The method of claim 1, wherein the second process comprises a process selected from the group consisting of a deposition process, a photolithography process, an etching process or a planarization process.

5. The method of claim 1, wherein the first process comprises a deposition process and the second process comprises an etching process.

6. The method of claim 1, wherein the first process comprises a deposition process and the second process comprises a chemical mechanical process.

7. The method of claim 1, wherein the first process comprises an etching process and the second process comprises a deposition process.

8. The method of claim 1, wherein the first process comprises a chemical mechanical polishing process and the second process comprises a deposition process.

9. The method of claim 1, wherein the first process comprises a photolithography process and the second process comprises an etching process.

10. The method of claim 1, wherein the first process comprises an etching process and the second process comprises a chemical mechanical polishing process.

11. The method of claim 1, wherein the first process comprises an etching process and the second process comprises an etching process.

12. The method of claim 1, wherein the measured data comprises information selected from the group consisting of a thickness of a film, a depth of a trench and a line width.

13. A semiconductor wafer treatment method comprising:
    performing a first process on a semiconductor wafer;
    obtaining a first measured data from the semiconductor wafer after the first process is performed, wherein the first measured data reflects a first deviation of each part within the semiconductor wafer;
    performing a second process on the semiconductor wafer after the first process based on the first measured data to compensate the first deviation generated from the first process;
    obtaining a second measured data from the semiconductor wafer after the second process is performed, wherein the second measured data reflects a second deviation of each part within the semiconductor wafer; and
    performing a third process on the semiconductor wafer after the second process based on the second measured data to compensate the second deviation generated from both the first and the second processes.

14. The method of claim 13, wherein before the step of performing the second process, the method further comprises:
    using an advanced process control device to perform a calculation on the first measured data to obtain a first operation parameter for the second process; and
    feeding forward the first operation parameter to the second process.

15. The method of claim 13, wherein before the step of performing the third process, the method further comprises:
    using an advanced process control device to perform a calculation on the second measured data to obtain a second operation parameter for the third process; and
    feeding forward the second operation parameter to the third process.

16. The method of claim 13, wherein the first process comprises a process selected from the group consisting of a deposition process, a photolithography process, an etching process and a planarization process.

17. The method of claim 13, wherein the second process comprises a process selected from the group consisting of a deposition process, a photolithography process, an etching process and a planarization process.

18. The method of claim 13, wherein the third process comprises a process selected from the group consisting of a deposition process, a photolithography process, an etching process and a planarization process.

19. The method of claim 13, wherein the first measured data comprises information selected from the group consisting of a thickness of a film, a depth of a trench and a line width.

20. The method of claim 13, wherein the second measured data comprises information selected from the group consisting of a thickness of a film, a depth of a trench and a line width.

* * * * *